United States Patent
Yeh et al.

(10) Patent No.: US 7,049,245 B2
(45) Date of Patent: May 23, 2006

(54) TWO-STEP GC ETCH FOR GC PROFILE AND PROCESS WINDOW IMPROVEMENT

(75) Inventors: Fang-Yu Yeh, Hsinchu (TW); Chi Lin, Hsinchu (TW); Chia-Yao Chen, Hsinchu (TW)

(73) Assignee: ProMOS Technologies, Inc., Hsinchu (TW)

( * ) Notice: Subject to any disclaimer, the term of this patent is extended or adjusted under 35 U.S.C. 154(b) by 54 days.

(21) Appl. No.: 10/660,821

(22) Filed: Sep. 12, 2003

(65) Prior Publication Data

US 2005/0059248 A1   Mar. 17, 2005

(51) Int. Cl.
*H01L 21/302* (2006.01)

(52) U.S. Cl. .............. 438/719; 438/720; 438/754; 438/755

(58) Field of Classification Search ............. 438/270, 438/283, 585–587, 706, 719–721, 745, 754, 438/755
See application file for complete search history.

(56) References Cited

U.S. PATENT DOCUMENTS

| | | | |
|---|---|---|---|
| 4,470,189 A * | 9/1984 | Roberts et al. ............ 438/301 |
| 4,742,025 A * | 5/1988 | Ohyu et al. ............... 438/694 |
| 4,833,099 A * | 5/1989 | Woo ........................ 438/230 |
| 5,700,737 A * | 12/1997 | Yu et al. .................. 438/636 |
| 5,751,048 A | 5/1998 | Lee et al. |
| 5,915,198 A | 6/1999 | Ko et al. |
| 5,989,987 A | 11/1999 | Kuo |
| 6,211,557 B1 | 4/2001 | Ko et al. |
| 6,331,478 B1 | 12/2001 | Lee et al. |
| 6,346,483 B1 * | 2/2002 | Ikeda ........................ 438/706 |
| 6,346,734 B1 * | 2/2002 | Divakaruni et al. ........ 257/413 |
| 6,437,411 B1 | 8/2002 | Choi et al. |

FOREIGN PATENT DOCUMENTS

GB    2373635    9/2002

* cited by examiner

*Primary Examiner*—Kin-Chan Chen
(74) *Attorney, Agent, or Firm*—Finnegan, Henderson, Farabow, Garrett & Dunner, L.L.P.

(57) ABSTRACT

A method for manufacturing a semiconductor device that comprises defining a semiconductor substrate, forming a gate oxide on the semiconductor substrate, forming a polycrystalline silicon layer over the gate oxide, forming a tungsten silicide layer over the polycrystalline silicon layer; providing a mask over the tungsten silicide layer, defining the mask to expose at least one portion of the tungsten silicide layer, etching the exposed tungsten silicide layer with a first etchant, wherein some tungsten silicide layer remains, etching the remaining tungsten silicide layer with a second etchant to expose at least one portion of the polycrystalline silicon layer, annealing the tungsten silicide layer, etching the exposed polycrystalline silicon layer, and oxidizing sidewalls of the tungsten silicide layer and the polycrystalline silicon layer.

19 Claims, 3 Drawing Sheets

TWO-STEP GC ETCH FOR GC PROFILE AND PROCESS WINDOW IMPROVEMENT

DESCRIPTION OF THE INVENTION

1. Field of the Invention

This invention pertains in general to semiconductor fabrication, and, more particularly, to a method of forming gate electrodes in manufacturing semiconductor devices.

2. Background of the Invention

In recent years, the gate electrode of a metal-oxide-semiconductor field effect transistor ("MOSFET") generally is comprised of a multi-layer structure rather than a single-layer structure. The multi-layer structure may include a polycrystalline silicon layer doped with phosphorus, and a metal silicide layer, for example, a tungsten silicide layer, formed over the polycrystalline silicon layer.

A conventional technique for forming a two-layer gate electrode is shown in FIGS. 1A to 1D. Referring to FIG. 1A, a gate oxide layer 12, a polycrystalline silicon layer 14, a tungsten silicide layer 16, and a mask layer 18 are sequentially formed over a semiconductor substrate 10. Mask layer 18 is defined and patterned by a photolithography process. Unmasked portions of tungsten silicide layer 16 and portions of polycrystalline silicon layer 14 underneath the unmasked portions of tungsten silicide layer 16 are sequentially removed by etching processes. The resultant structure is shown in FIG. 1B. In the etching process for tungsten silicide layer 16, tungsten silicide may be removed by low etch selective to polycrystalline silicon. In addition, due to the loading effect, etch rates are different at regions where gate densities are different. Typically, the etch rate at a high-density region, or the array region, is smaller than that of a low-density region, or the periphery region. As a result, some tungsten silicide may remain at the array region when tungsten silicide at the periphery region is removed.

Referring to FIG. 1C, tungsten silicide layer 16 is over-etched to remove the remaining tungsten silicide at the array region. The over-etch results in non-uniform thickness of polycrystalline silicon layers between the array and periphery regions. However, the thickness control of a polycrystalline silicon layer becomes increasingly important in view of the continued demand for scaled-down device size and high-integration of semiconductor integrated circuits. The non-uniform thickness of polycrystalline silicon layers also may cause failure in an end point detection in an etching process.

Referring to FIG. 1D, the conventional technique then employs a rapid thermal annealing ("RTA") process to anneal tungsten silicide layer 16, and then a rapid thermal oxidation ("RTO") process to form sidewall spacers 20 on tungsten silicide layers 16 and polycrystalline silicon layers 14. However, to ameliorate the non-uniformity defect described above, the thermal stress generated by the RTA followed by the RTO may cause a deformed profile of polycrystalline silicon layer 14, or an over-extrusion of tungsten silicide layer 16, which in turn results in short-circuiting of adjacent contacts.

SUMMARY OF THE INVENTION

Accordingly, the present invention is directed to methods that obviate one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the methods particularly pointed out in the written description and claims thereof, as well as the appended drawings.

To achieve these and other advantages, and in accordance with the purpose of the invention as embodied and broadly described, there is provided a method for manufacturing a semiconductor device that comprises defining a semiconductor substrate, forming a gate oxide on the semiconductor substrate, forming a polycrystalline silicon layer over the gate oxide, forming a tungsten silicide layer over the polycrystalline silicon layer; providing a mask over the tungsten silicide layer, defining the mask to expose at least one portion of the tungsten silicide layer, etching the exposed tungsten silicide layer with a first etchant, wherein some tungsten silicide layer remains, etching the remaining tungsten silicide layer with a second etchant to expose at least one portion of the polycrystalline silicon layer, annealing the tungsten silicide layer, etching the exposed polycrystalline silicon layer, and oxidizing sidewalls of the tungsten silicide layer and the polycrystalline silicon layer.

In one aspect of the present invention, the annealing of the tungsten silicide layer further comprises a rapid thermal annealing process.

In another aspect of the present invention, the oxidizing of sidewalls of the tungsten silicide layer further comprises a rapid thermal oxidization process.

Also in accordance with the present invention, there is provided a method for manufacturing a semiconductor device that comprises defining a semiconductor substrate, forming a gate oxide on the semiconductor substrate, forming a polycrystalline silicon layer over the gate oxide, forming a tungsten silicide layer over the polycrystalline silicon layer, providing a mask over the tungsten silicide layer, defining the mask to expose at least one portion of the tungsten silicide layer, etching the exposed tungsten silicide layer with a first etchant, wherein some tungsten silicide layer remains, annealing the tungsten silicide layer, etching the remaining tungsten silicide layer with a second etchant to expose at least one portion of the polycrystalline silicon layer, etching the exposed polycrystalline silicon layer, and oxidizing sidewalls of the tungsten silicide layer and the polycrystalline silicon layer.

Still in accordance with the present invention, there is provided a method of forming a gate structure of a semiconductor device that comprises defining a semiconductor substrate, forming a gate electrode over the semiconductor substrate, the gate electrode comprising a gate oxide, a polycrystalline silicon layer formed over the gate oxide, and a tungsten silicide layer formed over the polycrystalline silicon layer, providing a mask over the gate electrode, defining the mask to expose at least one portion of the tungsten silicide layer, etching the exposed tungsten silicide layer with a first etchant, wherein some tungsten silicide layer remains, etching the remaining tungsten silicide layer with a second etchant to expose at least one portion of the polycrystalline silicon layer, annealing the tungsten silicide layer, etching the exposed polycrystalline silicon layer, and oxidizing sidewalls of the tungsten silicide layer and the polycrystalline silicon layer.

Yet still in accordance with the present invention, there is provided a method of forming a gate structure of a semiconductor device that comprises defining a semiconductor substrate, forming a gate electrode over the semiconductor substrate, the gate electrode comprising a gate oxide, a polycrystalline silicon layer formed over the gate oxide, and a tungsten silicide layer formed over the polycrystalline silicon layer, providing a mask over the gate electrode, defining the mask to expose at least one portion of the tungsten silicide layer, etching the exposed tungsten silicide layer with a first etchant, wherein some tungsten silicide layer remains, annealing the tungsten silicide layer, etching the remaining tungsten silicide layer with a second etchant to expose at least one portion of the polycrystalline silicon layer, etching the exposed polycrystalline silicon layer, and oxidizing sidewalls of the tungsten silicide layer and the polycrystalline silicon layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawings.

DESCRIPTION OF THE EMBODIMENTS

Reference will now be made in detail to the present embodiments of the invention, examples of which are illustrated in the accompanying drawings. Wherever possible, the same reference numbers will be used throughout the drawings to refer to the same or like parts.

Figure 1A:
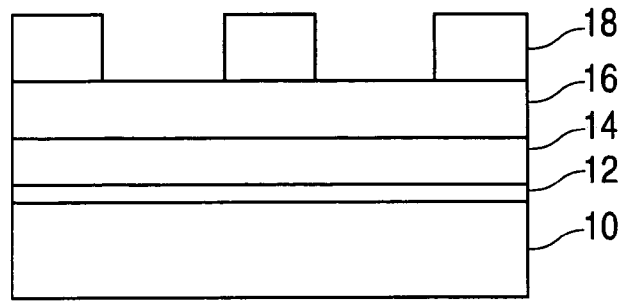
FIGS. 1A to 1D show a conventional technique in the art for forming a gate electrode of a semiconductor device.
Figure 1B:
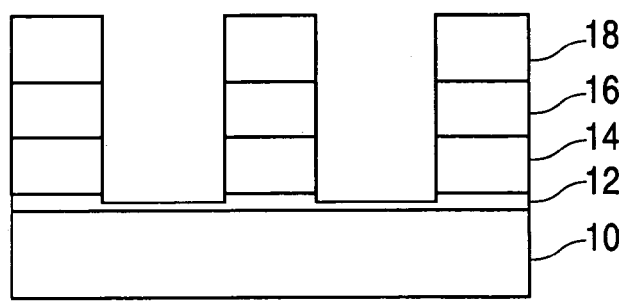
Figure 1C:
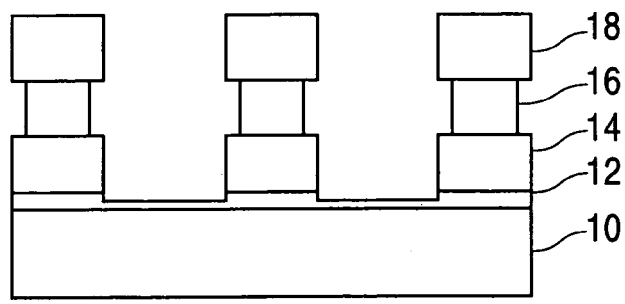
Figure 1D:
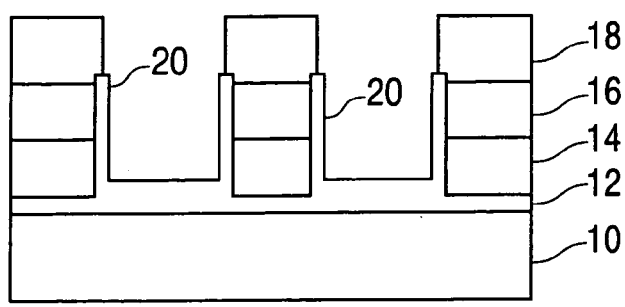
Figure 2A:
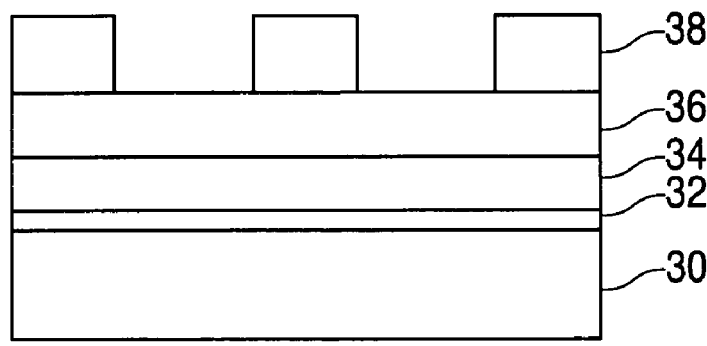
FIGS. 2A to 2F show a method of forming a gate electrode in accordance with one embodiment of the present invention.

FIGS. 2A to 2F show a method of forming a gate electrode in accordance with one embodiment of the present invention. Referring to FIG. 2A, the method begins with defining a semiconductor substrate 30, which may include cleaning and doping a semiconductor wafer. A gate oxide layer 32, for example, a silicon dioxide ($SiO_2$) layer, is formed on semiconductor substrate 30. Next, a layered gate structure including a polycrystalline silicon layer 34 and a tungsten silicide layer 36 formed over polycrystalline silicon layer 34 is formed on gate oxide layer 32. A mask layer 38, for example, a silicon nitride layer, is formed over tungsten silicide layer 36. Mask layer 38 is defined and patterned by a conventional photolithography technique.

Figure 2B:
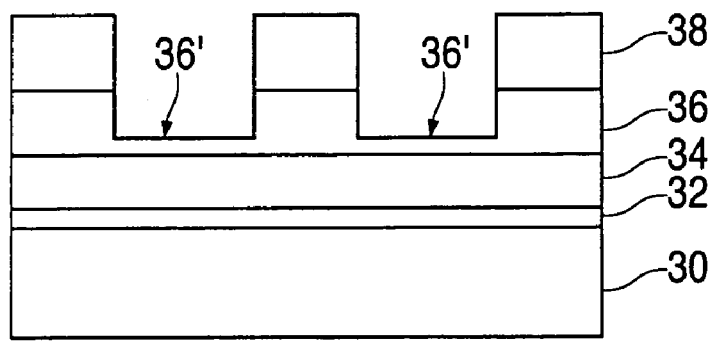
Figure 2B:
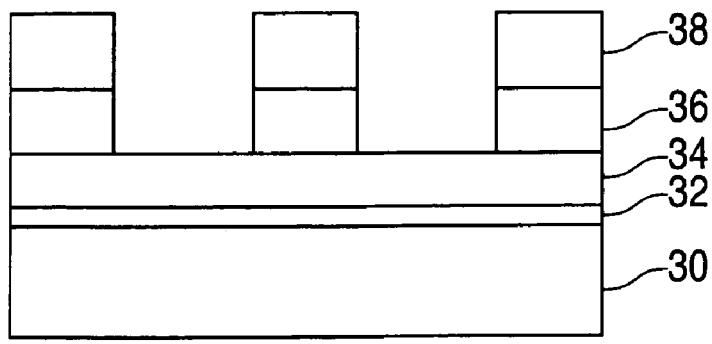

FIG. 2B is a cross-sectional view of the array region. FIG. 2B' is a cross-sectional view of the periphery region. Referring to FIGS. 2B and 2B', unmasked portions of tungsten silicide layer 36 are etched by a first etchant. In one embodiment, the first etchant includes a gas selected from HCl, $Cl_2$ and $He/O_2$. Due to the loading effect, when tungsten silicide at the periphery region is removed where gate density is relatively low (FIG. 2B'), some tungsten silicide 36' remains at the array region where gate density is relatively high (FIG. 2B).

Figure 2C:
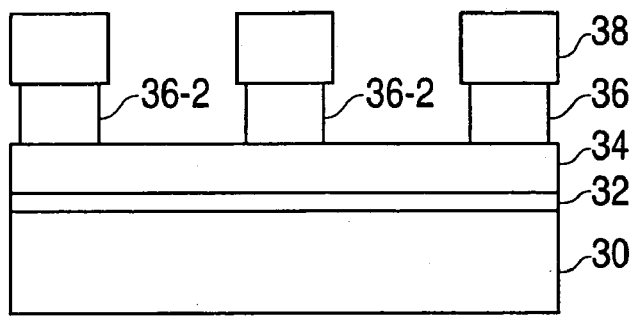

Referring to FIG. 2C, an etch back step with a second etchant is performed to remove the remaining tungsten silicide 36'. In one embodiment, the second etchant includes a base such as $NH_4OH/H_2O_2$. The etch back process based on the second etchant is performed at a temperature ranging from approximately 55° C. to 75° C. With respect to the second etchant, tungsten silicide is etched selectively relative to polycrystalline silicon. The etch-back step reduces sidewalls 36-2 of tungsten silicide layer 36.

Figure 2D:
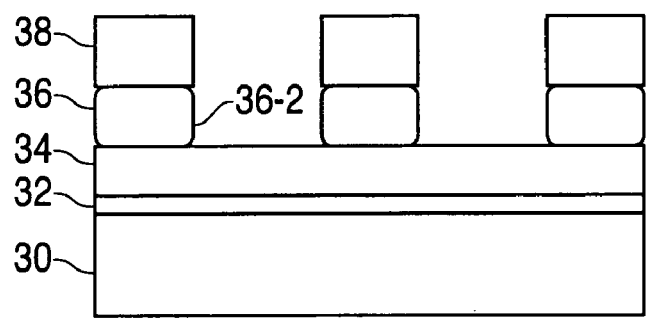

Referring to FIG. 2D, a first heat treatment, for example, a rapid thermal annealing ("RTA") process, is performed to anneal tungsten silicide layer 36. The first heat treatment induces a phase transition in tungsten silicide, and increases sidewalls 36-2 of tungsten silicide layer 36 by regrowing tungsten silicide thereon.

Figure 2E:
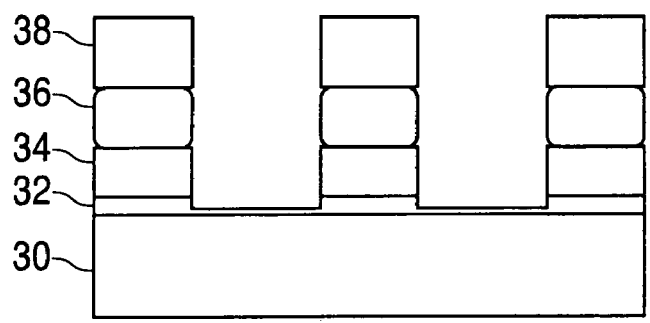
Figure 2F:
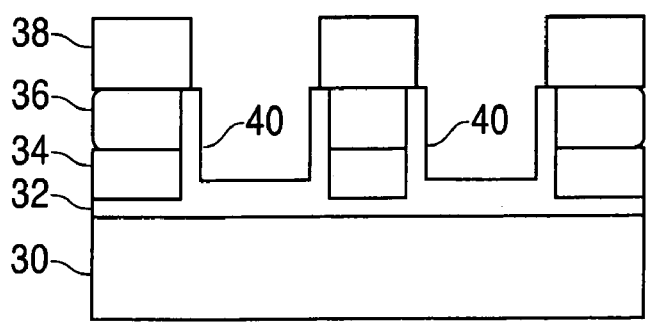

Referring to FIG. 2E, unmasked portions of polycrystalline silicon layer 34 are removed by an etching process. Next, referring to FIG. 2F, a second heat treatment, for example, a rapid thermal oxidization ("RTO") process, is performed to form spacers 40 on sidewalls of tungsten silicide layer 36 and polycrystalline silicon layer 34. Since the first and second heat treatments are separated in time from each other by the etching process of polycrystalline silicon layer 34, thermal stress against polycrystalline silicon layer 34 and tungsten silicide layer 36 is alleviated, as compared to the thermal stress generated by the conventional technique.

In one embodiment according to the present invention, the step of performing a first heat treatment (FIG. 2D) is conducted before the step of etching the remaining tungsten silicide 36' (FIG. 2C). This embodiment reduces the risk of short-circuiting between adjacent contacts due to over-extrusion of tungsten silicide layer 36.

It will be apparent to those skilled in the art that various modifications and variations can be made in the disclosed methods without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for manufacturing a semiconductor device comprising:

defining a semiconductor substrate;

forming a gate oxide on the semiconductor substrate;

forming a polycrystalline silicon layer over the gate oxide;

forming a tungsten silicide layer over the polycrystalline silicon layer;

providing a mask over the tungsten silicide layer;

defining the mask to expose at least one portion of the tungsten silicide layer;

etching the exposed tungsten silicide layer with a first etchant, wherein some tungsten silicide layer remains;

etching the remaining tungsten silicide layer with a second etchant to expose at least one portion of the polycrystalline silicon layer;

annealing the tungsten silicide layer;

etching the exposed polycrystalline silicon layer; and oxidizing sidewalls of the tungsten silicide layer and the polycrystalline silicon layer.

2. The method of claim 1, wherein the annealing of the tungsten silicide layer further comprises a rapid thermal annealing process.

3. The method of claim 1, wherein the oxidizing of sidewalls of the tungsten silicide layer further comprises a rapid thermal oxidization process.

4. The method of claim 1, wherein the tungsten silicide is etch selective to polycrystalline silicon with respect to the second etchant.

5. The method of claim 1, wherein the etching of the remaining tungsten silicide layer uses a base as the second etchant.

6. The method of claim 1, wherein the etching of the remaining tungsten silicide layer etches back the remaining tungsten silicide layer.

7. The method of claim 1, wherein the annealing of the tungsten silicide layer increases sidewalls of the tungsten silicide layer.

8. A method of forming a gate structure of a semiconductor device comprising:
   defining a semiconductor substrate;
   forming a gate electrode over the semiconductor substrate, the gate electrode comprising a gate oxide, a polycrystalline silicon layer formed over the gate oxide, and a tungsten silicide layer formed over the polycrystalline silicon layer;
   providing a mask over the gate electrode;
   defining the mask to expose at least one portion of the tungsten silicide layer;
   etching the exposed tungsten silicide layer with a first etchant, wherein some tungsten silicide layer remains;
   etching the remaining tungsten silicide layer with a second etchant to expose at least one portion of the polycrystalline silicon layer;
   annealing the tungsten silicide layer;
   etching the exposed polycrystalline silicon layer; and
   oxidizing sidewalls of the tungsten silicide layer and the polycrystalline silicon layer.

9. The method of claim 8, prior to the forming of a gate electrode over the semiconductor substrate, further comprising the step of forming an insulating layer over the semiconductor substrate.

10. The method of claim 8, wherein the annealing of the tungsten silicide layer further comprises a rapid thermal annealing process.

11. The method of claim 8, wherein the oxidizing of sidewalls of the tungsten silicide layer further comprises a rapid thermal oxidization process.

12. The method of claim 8, wherein the tungsten silicide is etch selective to polycrystalline silicon with respect to the second etchant.

13. The method of claim 8, wherein the etching of the remaining tungsten silicide layer uses a base as the second etchant.

14. The method of claim 13, wherein the etching of the remaining tungsten silicide layer is performed at a temperature ranging from approximately 55° C. to 75° C.

15. The method of claim 8, wherein the mask includes silicon nitride.

16. A method of forming a gate structure of a semiconductor device comprising:
   defining a semiconductor substrate;
   forming a gate electrode over the semiconductor substrate, the gate electrode comprising a gate oxide, a polycrystalline silicon layer formed over the gate oxide, and a tungsten silicide layer formed over the polycrystalline silicon layer;
   providing a mask over the gate electrode;
   defining the mask to expose at least one portion of the tungsten silicide layer;
   etching the exposed tungsten silicide layer with a first etchant, wherein some tungsten silicide layer remains;
   annealing the tungsten silicide layer;
   etching the remaining tungsten silicide layer with a second etchant to expose at least one portion of the polycrystalline silicon layer;
   etching the exposed polycrystalline silicon layer; and
   oxidizing sidewalls of the tungsten silicide layer and the polycrystalline silicon layer.

17. The method of claim 16, wherein the annealing of the tungsten silicide layer increases sidewalls of the tungsten silicide layer.

18. The method of claim 16, wherein the second etchant includes $NH_4OH/H_2O_2$.

19. The method of claim 16, wherein the etching of the remaining tungsten silicide layer is performed at a temperature ranging from approximately 55° C. to 75° C.

* * * * *